(12) United States Patent
Hamada et al.

(10) Patent No.: US 11,744,156 B2
(45) Date of Patent: Aug. 29, 2023

(54) MULTILAYER PIEZOELECTRIC ELEMENT, PIEZOELECTRIC VIBRATION APPARATUS, AND ELECTRONIC DEVICE

(71) Applicant: TAIYO YUDEN CO., LTD., Tokyo (JP)

(72) Inventors: Hiroshi Hamada, Takasaki (JP); Hiroyuki Shimizu, Takasaki (JP); Sumiaki Kishimoto, Takasaki (JP); Yukihiro Matsui, Takasaki (JP); Shigeo Ishii, Takasaki (JP); Tomohiro Harada, Takasaki (JP); Yukihiro Konishi, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 1174 days.

(21) Appl. No.: 16/049,348

(22) Filed: Jul. 30, 2018

(65) Prior Publication Data

US 2019/0044053 A1 Feb. 7, 2019

(30) Foreign Application Priority Data

Aug. 7, 2017 (JP) .................................. 2017-152262
Feb. 28, 2018 (JP) .................................. 2018-034063

(51) Int. Cl.
*H01L 41/083* (2006.01)
*H01L 41/047* (2006.01)
(Continued)

(52) U.S. Cl.
CPC ......... *H10N 30/508* (2023.02); *H10N 30/063* (2023.02); *H10N 30/073* (2023.02);
(Continued)

(58) Field of Classification Search
CPC ... H01L 41/257; H01L 41/273; H01L 41/293; H01L 41/313; H01L 41/0471;
(Continued)

(56) References Cited

U.S. PATENT DOCUMENTS

2016/0099400 A1\* 4/2016 Uetani ................ H01L 41/0477
310/365
2017/0133578 A1\* 5/2017 Suenaga ............... B06B 1/0611
2017/0311086 A1 10/2017 Ishii et al.

FOREIGN PATENT DOCUMENTS

JP 2016100760 A 5/2016
WO 2016052582 A1 4/2016

\* cited by examiner

*Primary Examiner* — Shawki S Ismail
*Assistant Examiner* — Monica Mata
(74) *Attorney, Agent, or Firm* — Law Office of Katsuhiro Arai

(57) ABSTRACT

A multilayer piezoelectric element includes a ceramic body formed by a piezoelectric ceramic, and having first and second end face facing a longitudinal direction, first and second principal faces facing a thickness direction perpendicular to the longitudinal direction. A pair of external electrodes cover the first and second end faces, extend from the first and second end faces onto the first principal face via ridge parts connecting the end faces with the principal faces, and project in the thickness direction on the first principal face. Multiple internal electrodes are stacked inside the ceramic body and are connected alternately to the pair of external electrodes along the thickness direction. A surface electrode is provided on at least one of the first and second principal faces, and connected to the external electrode different from the one to which the internal electrode adjacent in the thickness direction is connected.

9 Claims, 9 Drawing Sheets

(51) Int. Cl.
    *H01L 41/09*    (2006.01)
    *H01L 41/273*   (2013.01)
    *H01L 41/293*   (2013.01)
    *H01L 41/257*   (2013.01)
    *H01L 41/313*   (2013.01)
    *H10N 30/50*    (2023.01)
    *H10N 30/063*   (2023.01)
    *H10N 30/073*   (2023.01)
    *H10N 30/20*    (2023.01)
    *H10N 30/87*    (2023.01)
    *G06F 3/01*     (2006.01)
    *H10N 30/045*   (2023.01)
    *H10N 30/053*   (2023.01)

(52) U.S. Cl.
    CPC ......... *H10N 30/206* (2023.02); *H10N 30/872* (2023.02); *G06F 3/016* (2013.01); *H10N 30/045* (2023.02); *H10N 30/053* (2023.02); *H10N 30/871* (2023.02)

(58) Field of Classification Search
    CPC ............. H01L 41/0472; H01L 41/0838; H01L 41/0986; G06F 3/016
    USPC ........................................................ 310/328
    See application file for complete search history.

MULTILAYER PIEZOELECTRIC ELEMENT, PIEZOELECTRIC VIBRATION APPARATUS, AND ELECTRONIC DEVICE

BACKGROUND

Field of the Invention

The present invention relates to a multilayer piezoelectric element, a piezoelectric vibration apparatus, and an electronic device, in which the transverse piezoelectric effect is utilized.

Description of the Related Art

Patent Literature 1 discloses a multilayer piezoelectric element having a piezoelectric body constituted by stacked piezoelectric layers. This multilayer piezoelectric element has a long and thin shape whose dimension in the longitudinal direction intersecting at right angles with the stacking direction of the piezoelectric body is large. Having such shape, the multilayer piezoelectric element achieves the transverse piezoelectric effect in a favorable manner and thus can expand/contract greatly in the longitudinal direction.

In addition, Patent Literature 1 discloses a piezoelectric vibration apparatus constituted by the aforementioned multilayer piezoelectric element and a vibration plate joined to it. This piezoelectric vibration apparatus is such that the multilayer piezoelectric element extends in the longitudinal direction along the vibration plate, and any expansion/contraction of the multilayer piezoelectric element in the longitudinal direction is transmitted to the vibration plate. As a result, this piezoelectric vibration apparatus can vibrate the vibration plate.

BACKGROUND ART LITERATURES

[Patent Literature 1] Japanese Patent Laid-open No. 2016-100760

[Patent Literature 2] International Patent Laid-open No. 2016/052582

SUMMARY

In the case of a multilayer piezoelectric element having a long and thin shape, any external stress it receives due to impact etc., tends to apply to both end parts in the longitudinal direction. A stress that applies to both end parts of the multilayer piezoelectric element in the longitudinal direction tends to concentrate on the ridge parts of the piezoelectric body. For this reason, a multilayer piezoelectric element having a long and thin shape easily generates cracks originating from the ridge parts of the piezoelectric body.

In light of the aforementioned situation, an object of the present invention is to provide a multilayer piezoelectric element, a piezoelectric vibration apparatus, and an electronic device, characterized by excellent reliability.

Any discussion of problems and solutions involved in the related art has been included in this disclosure solely for the purposes of providing a context for the present invention, and should not be taken as an admission that any or all of the discussion were known at the time the invention was made.

To achieve the aforementioned object, the multilayer piezoelectric element pertaining to a mode of the present invention comprises a ceramic body, a pair of external electrodes, multiple internal electrodes, and surface electrodes.

The ceramic body is formed by a piezoelectric ceramic, and has first and second end faces facing a longitudinal direction, first and second principal faces facing a thickness direction intersecting the longitudinal direction at right angles, and ridge parts connecting the first and second end faces with the first and second principal faces.

The pair of external electrodes cover the first and second end faces, extend from the first and second end faces onto the first principal face via the ridge parts, and project in the thickness direction on the first principal face.

The multiple internal electrodes are stacked inside the ceramic body along the thickness direction and are connected alternately to the pair of external electrodes along the thickness direction.

The surface electrodes are provided on at least one of the first and second principal faces, and each is connected to the external electrode different from the one to which the internal electrode adjacent in the thickness direction is connected.

On the pair of external electrodes of this multilayer piezoelectric element, apex parts projecting in the thickness direction are formed on the first principal face of the ceramic body. Because of this, any external stress that applies to the pair of external electrodes tends to do so at the apex parts. However, the pair of external electrodes are such that any stress that applies to the apex parts facing the first principal face is dispersed along the first principal face and thus does not easily concentrate on the ridge parts of the ceramic body. As a result, this multilayer piezoelectric element achieves high reliability because generation of cracks originating from the ridge parts on the first principle face side of the ceramic body is reduced.

The pair of external electrodes may extend from the first and second end faces onto the second principal face via the ridge parts and project in the thickness direction on the second principal face.

This multilayer piezoelectric element achieves even higher reliability because generation of cracks originating from the ridge parts on the second principal face side of the ceramic body is also reduced.

The ridge parts may be constituted by curved faces.

With this multilayer piezoelectric element, any stress that applies to the ridge parts of the ceramic body is distributed along the curved faces constituting the ridge parts. As a result, this multilayer piezoelectric element does not allow a local stress to apply easily to the ridge parts of the ceramic body and therefore generation of cracks originating from the ridge parts of the ceramic body is more effectively reduced.

The piezoelectric vibration apparatus pertaining to a mode of the present invention comprises the aforementioned multilayer piezoelectric element, a vibration plate, and an adhesive layer.

The vibration plate faces the multilayer piezoelectric element in the thickness direction.

The adhesive layer is placed between the multilayer piezoelectric element and the vibration plate.

This piezoelectric vibration apparatus achieves high reliability because generation of cracks in the multilayer piezoelectric element, originating from the ridge parts of the ceramic body, is reduced when the piezoelectric vibration apparatus is manufactured, driven, etc.

The multilayer piezoelectric element may be placed with the first principal face oriented toward the vibration plate side.

This piezoelectric vibration apparatus is such that, when it is driven, etc., any stress that applies to the multilayer piezoelectric element from the vibration plate does not easily generate cracks that originate from the ridge parts on the first principal face side of the ceramic body.

The pair of external electrodes of the multilayer piezoelectric element may be placed partially inside the adhesive layer.

The adhesive layer may be filled between the first principal face and the vibration plate.

These constitutions increase the adhesive strength between the multilayer piezoelectric element and the vibration plate, and therefore any expansion/contraction of the multilayer piezoelectric element in the longitudinal direction is transmitted efficiently to the vibration plate. As a result, this piezoelectric vibration apparatus can vibrate the vibration plate to a greater extent.

The electronic device pertaining to a mode of the present invention comprises the aforementioned multilayer piezoelectric element, a panel, and a housing.

The panel has the multilayer piezoelectric element adhered to it in a manner facing the panel in the thickness direction.

The housing retains the panel.

According to the present invention, a multilayer piezoelectric element, a piezoelectric vibration apparatus, and an electronic device, characterized by excellent reliability, can be provided.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

DESCRIPTION OF THE SYMBOLS

Figure 1:
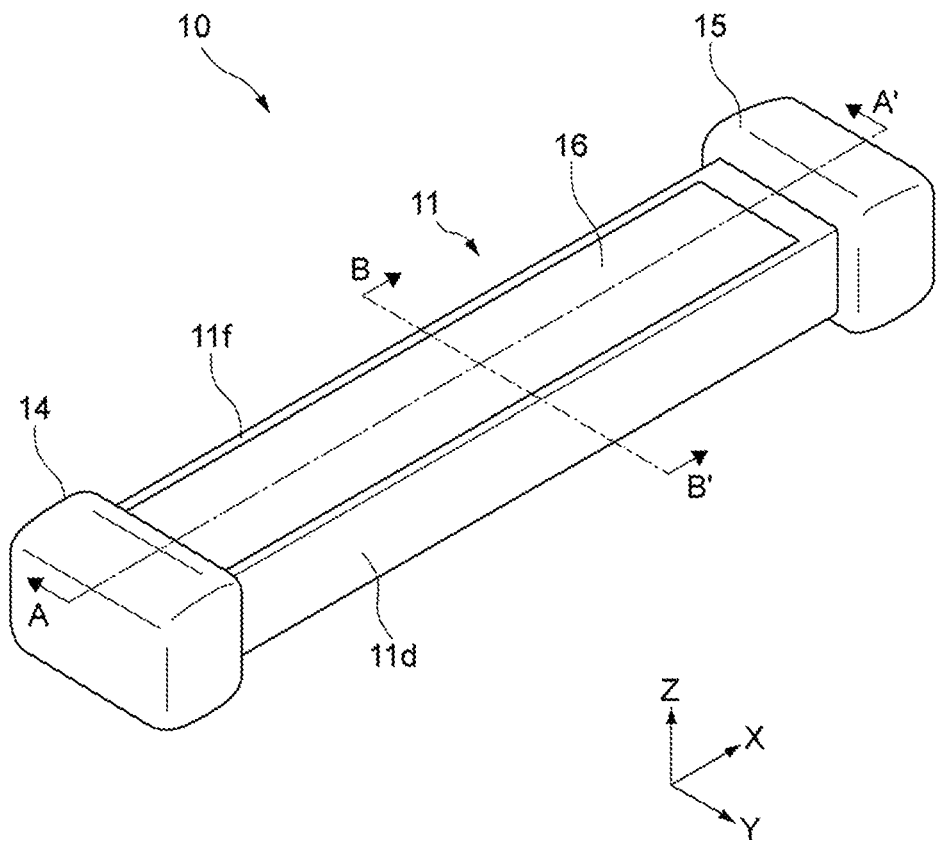
FIG. 1 is a perspective view of the multilayer piezoelectric element pertaining to an embodiment of the present invention.

10 - - - Multilayer piezoelectric element
11 - - - Ceramic body
11a, 11b - - - End face
11c, 11d - - - Side face
11e, 11f - - - Principal face
11g - - - Ridge part
12, 13 - - - Internal electrode
14, 15 - - - External electrode
14a, 15a - - - Apex part
16, 17 - - - Surface electrode
18 - - - Ceramic layer
20 - - - Piezoelectric vibration apparatus
21 - - - Vibration plate
22 - - - Adhesive layer
30 - - - Electronic device
31 - - - Housing
32 - - - Panel Detailed Description of Embodiments An embodiment of the present invention is explained below by referring to the drawings. In the drawings, the X-axis, Y-axis, and Z-axis, intersecting at right angles with one another, are shown as deemed appropriate. The X-axis, Y-axis, and Z-axis are the same in all drawings.

[Basic Constitution of Multilayer Piezoelectric Element 10]

Figure 2:
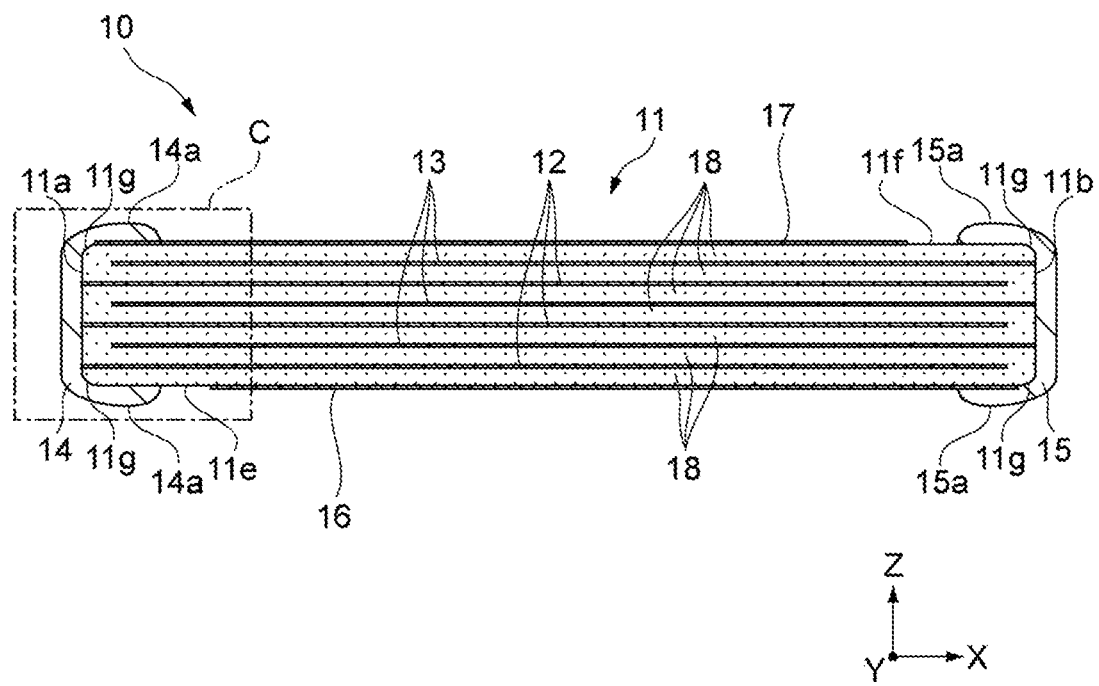
FIG. 2 is a cross-sectional view of the multilayer piezoelectric element along line A-A' in FIG. 1.
Figure 3:
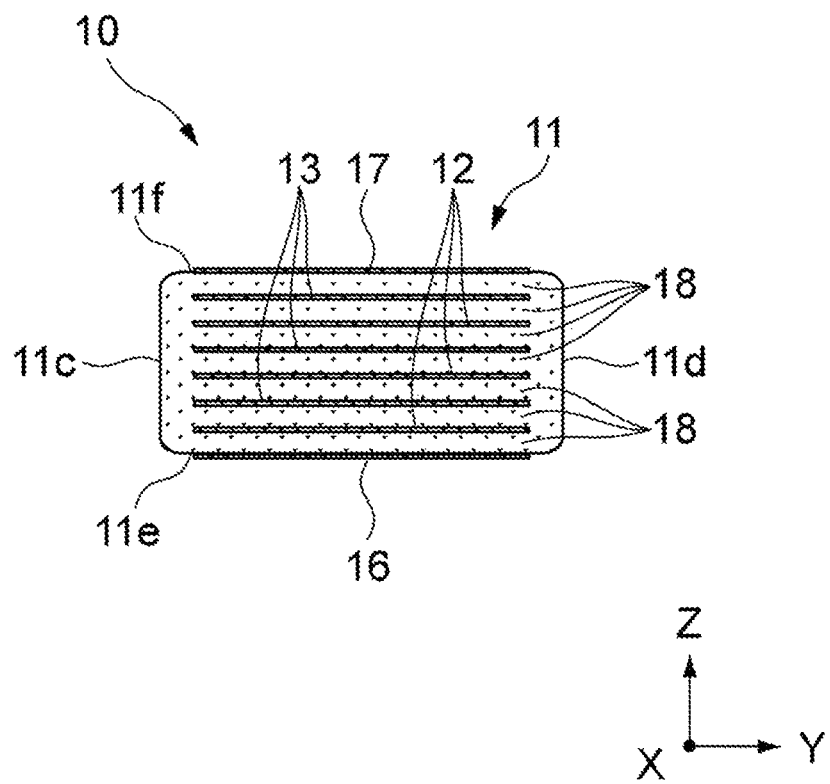
FIG. 3 is a cross-sectional view of the multilayer piezoelectric element along line B-B' in FIG. 1.

FIGS. 1 to 3 are drawings providing schematic representations of the basic constitution of the multilayer piezoelectric element 10 pertaining to an embodiment of the present invention. FIG. 1 is a perspective view of the multilayer piezoelectric element 10. FIG. 2 is a cross-sectional view of the multilayer piezoelectric element 10 along line A-A' in FIG. 1. FIG. 3 is a cross-sectional view of the multilayer piezoelectric element 10 along line B-B' in FIG. 1.

The multilayer piezoelectric element 10 has a longitudinal direction along the X-axis, a width direction along the Y-axis, and a thickness direction along the Z-axis. In other words, the multilayer piezoelectric element 10 is formed elongated in the X-axis direction. This means that, in the case of the multilayer piezoelectric element 10, deformation in the X-axis direction due to the transverse piezoelectric effect is more dominant than deformation in the Z-axis direction due to the longitudinal piezoelectric effect.

The multilayer piezoelectric element 10 comprises a ceramic body 11, a first external electrode 14, and a second external electrode 15. The ceramic body 11 has first and second end faces 11a, 11b facing the X-axis direction, first and second side faces 11c, 11d facing the Y-axis direction, and first and second principal faces 11e, 11f facing the Z-axis direction.

Also, as shown in FIG. 2, the ceramic body 11 has four ridge parts 11g that extend in the X-axis direction and connect the end faces 11a, 11b with the principal faces 11e, 11f. Preferably each ridge part 11g is constituted by a smooth curved face. It should be noted that the shape of the ceramic body 11 is not limited to the one shown in FIGS. 1 to 3.

The first external electrode 14 covers the first end face 11a of the ceramic body 11 and extends from the first end face 11a onto the principal faces 11e, 11f via the ridge parts 11g. The second external electrode 15 covers the second end face 11b of the ceramic body 11 and extends from the second end face 11b onto the principal faces 11e, 11f via the ridge parts 11g.

Accordingly, both of the external electrodes 14, 15 are such that their cross-section along the XZ plane is shaped like the letter U, as shown in FIG. 2. In addition, the external electrodes 14, 15 also extend from the end faces 11a, 11b onto the side faces 11c, 11d. In the case of the multilayer piezoelectric element 10, however, the constitution of the external electrodes 14, 15 extending onto the side faces 11c, 11d is not essential.

The external electrodes 14, 15 are formed by a good electrical conductor. Good electrical conductors by which to form the external electrodes 14, 15 include metals such as copper (Cu), nickel (Ni), tin (Sn), palladium (Pd), platinum (Pt), silver (Ag), gold (Au), etc., or alloys whose primary component is any of the foregoing, for example.

The ceramic body 11 is formed by a piezoelectric ceramic whose absolute value of piezoelectric constant $d_{31}$ is large. Lead-free materials include materials based on lithium niobate ($LiNbO_3$) and lithium tantalate ($LiTaO_3$), for example. Lead materials include materials based on lead zirconate titanate ($PbZrO_3$—$PbTiO_3$), for example.

First internal electrodes 12 and second internal electrodes 13 are provided inside the ceramic body 11. Both internal electrodes 12, 13 are sheet-shaped and extending along the XY plane, and placed alternately along the Z-axis direction with spacing between. In other words, the internal electrodes 12, 13 are covered by the piezoelectric ceramic.

This means that ceramic layers 18, which are layers of the piezoelectric ceramic, are formed between the internal electrodes 12, 13. The first internal electrodes 12 are led out to the first end face 11a of the ceramic body 11, and connected to the first external electrode 14. The second internal electrodes 13 are led out to the second end face 11b of the ceramic body 11, and connected to the second external electrode 15.

As shown in FIG. 3, the internal electrodes 12, 13 are placed with a spacing between them and the side faces 11c, 11d. In other words, a side margin part that forms a spacing is provided between the internal electrodes 12, 13 and the side faces 11c, 11d in the ceramic body 11. This ensures insulation property of the internal electrodes 12, 13 at the side faces 11c, 11d.

The ceramic body 11 has a first surface electrode 16 provided on the first principal face 11e, and a second surface electrode 17 provided on the second principal face 11f. As a result, a ceramic layer 18 is also formed between the top second internal electrode 13 in the Z-axis direction and the first surface electrode 16, and between the bottom first internal electrode 12 in the Z-axis direction and the second surface electrode 17.

The first surface electrode 16 is led out to the first end face 11a of the ceramic body 11 and connected to the first external electrode 14, just like the first internal electrodes 12. Also, the second surface electrode 17 is led out to the second end face 11b of the ceramic body 11 and connected to the second external electrode 15, just like the second internal electrodes 13.

The internal electrodes 12, 13 and surface electrodes 16, 17 are formed by a good electrical conductor, respectively. Good electrical conductors by which to form the internal electrodes 12, 13 and surface electrodes 16, 17 include metals such as nickel (Ni), copper (Cu), palladium (Pd), platinum (Pt), silver (Ag), gold (Au), etc., or alloys whose primary component is any of the foregoing, for example.

According to the aforementioned constitution, applying voltage between the first external electrode 14 and the second external electrode 15, of the multilayer piezoelectric element 10, causes voltage to be applied to all ceramic layers 18 in the Z-axis direction. As a result, each ceramic layer 18 contracts in the X-axis direction due to the transverse piezoelectric effect and therefore the multilayer piezoelectric element 10 as a whole contracts in the X-axis direction.

It should be noted that the basic constitution of the multilayer piezoelectric element 10 pertaining to this embodiment is not limited to the one shown in FIGS. 1 to 3 and can be modified as deemed appropriate. For example, the number of internal electrodes 12, 13 or the ceramic layer 18 thickness can be determined in any way as deemed appropriate according to the application of the multilayer piezoelectric element 10, and the like. Also, the number of internal electrodes 12 may be different from that of internal electrodes 13.

The constitution of the surface electrodes 16, 17 can be modified according to the constitution of the internal electrodes 12, 13. To be specific, the surface electrodes 16, 17 are each connected to one of the external electrode 14 or 15 to which the internal electrode 12 or 13 adjacent in the Z-axis direction is not connected. Also, one of the surface electrodes 16, 17 need not be provided on the multilayer piezoelectric element 10.

[Detailed Constitution of External Electrodes 14, 15]

As shown in FIG. 2, the external electrodes 14, 15 have apex parts 14a, 15a provided on the principal faces 11e, 11f of the ceramic body 11. In other words, the external electrodes 14, 15 project downward in the Z-axis direction at the apex parts 14a, 15a on the first principal face 11e, and project upward in the Z-axis direction at the apex parts 14a, 15a on the second principal face 11f.

The apex parts 14a, 15a of the external electrodes 14, 15 on the first principal face 11e constitute the bottom part of the multilayer piezoelectric element 10 in the Z-axis direction, and thus tend to receive stress from below in the Z-axis direction. Also, the apex parts 14a, 15a of the external electrodes 14, 15 on the second principal face 11f constitute the top part of the multilayer piezoelectric element 10 in the Z-axis direction, and thus tend to receive stress from above in the Z-axis direction.

Figure 4:
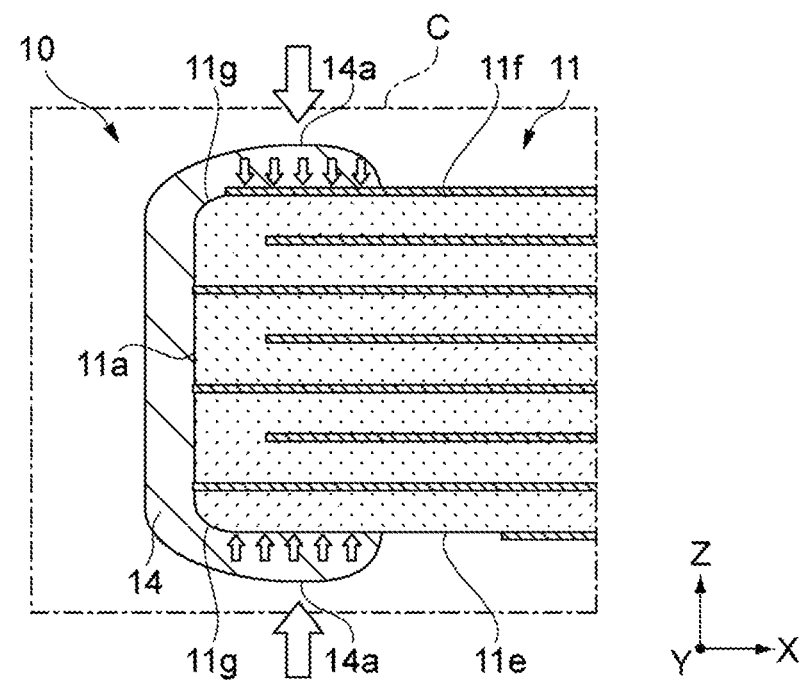
FIG. 4 is a partially enlarged cross-sectional view of region C of the multilayer piezoelectric element in FIG. 2.

FIG. 4 is a partially enlarged cross-sectional view of region C of the multilayer piezoelectric element 10 in FIG. 2, enclosed by the dashed-dotted line. In the case of the first external electrode 14, where the apex parts 14a are placed on the inward side of the ridge parts 11g of the ceramic body 11 in the X-axis direction, any stress that applies to the apex parts 14a is dispersed along the principal faces 11e, 11f without concentrating on the ridge parts 11g.

Similarly, in the case of the second external electrode 15, where the apex parts 15a are placed on the inward side of the ridge parts 11g of the ceramic body 11 in the X-axis direction, any stress that applies to the apex parts 15a is also dispersed along the principal faces 11e, 11f without concentrating on the ridge parts 11g. As a result, the multilayer piezoelectric element 10 does not easily have a stress concentrating on the ridge parts 11g of the ceramic body 11.

Also, with the ceramic body 11, whose ridge parts 11g are constituted by curved faces, any stress that applies to the ridge parts 11g is dispersed along the curved faces that constitute the ridge parts 11g. As a result, the multilayer piezoelectric element 10 can reduce local stress application to the ridge parts 11g of the ceramic body 11.

As described above, the multilayer piezoelectric element 10 is constituted in such a way that a large stress does not easily apply to the ridge parts 11g of the ceramic body 11. This means that, with the multilayer piezoelectric element 10, generation of cracks originating from the ridge parts 11g of the ceramic body 11 can be reduced. As a result, the multilayer piezoelectric element 10 achieves high reliability.

Comparative Example

Figure 5A:
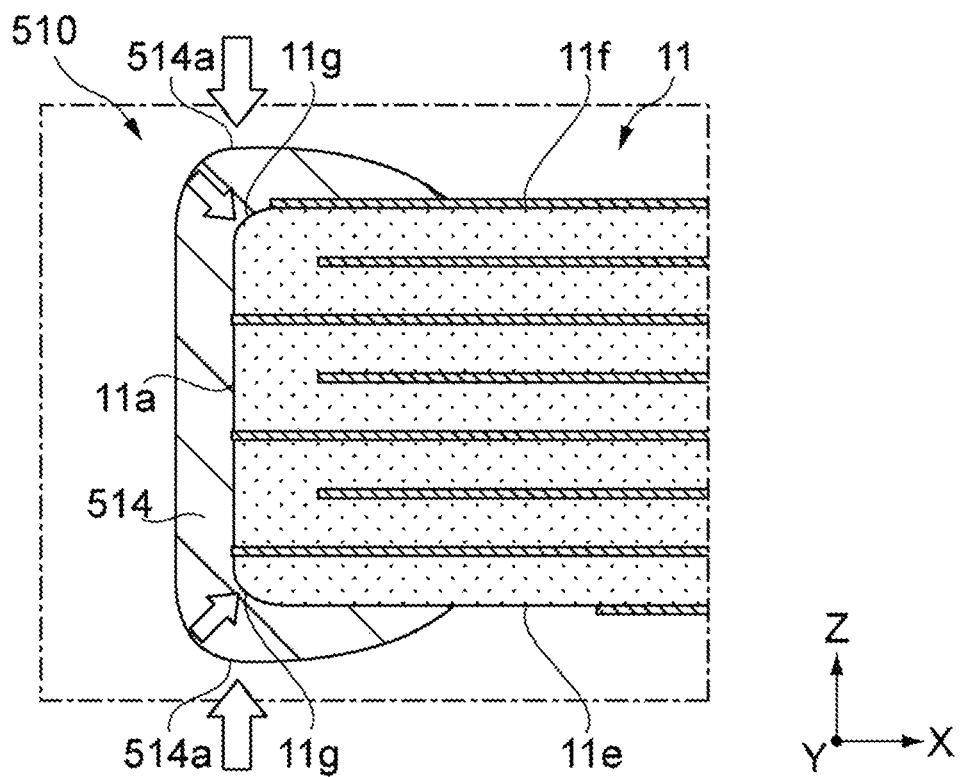
FIG. 5A is a partial cross-sectional view showing Comparative Example 1 of the multilayer piezoelectric element.

FIG. 5A is a partial cross-sectional view of a multilayer piezoelectric element 510 pertaining to Comparative Example 1. On the multilayer piezoelectric element 510 pertaining to Comparative Example 1, external electrodes 514 constituted differently from those of the multilayer piezoelectric element 10 pertaining to an embodiment of the present invention, are provided. On the external electrodes 514, apex parts 514a projecting in the Z-axis direction are provided on the outward side of the principal faces 11e, 11f of the ceramic body 11 in the X-axis direction.

With the multilayer piezoelectric element 510 pertaining to Comparative Example 1, the apex parts 514a of the external electrodes 514 are facing the ridge parts 11g of the ceramic body 11, and therefore any stress that applies to the apex parts 514a tends to concentrate on the ridge parts 11g. As a result, the multilayer piezoelectric element 510 tends to generate cracks originating from the ridge parts 11g of the ceramic body 11.

Figure 5B:
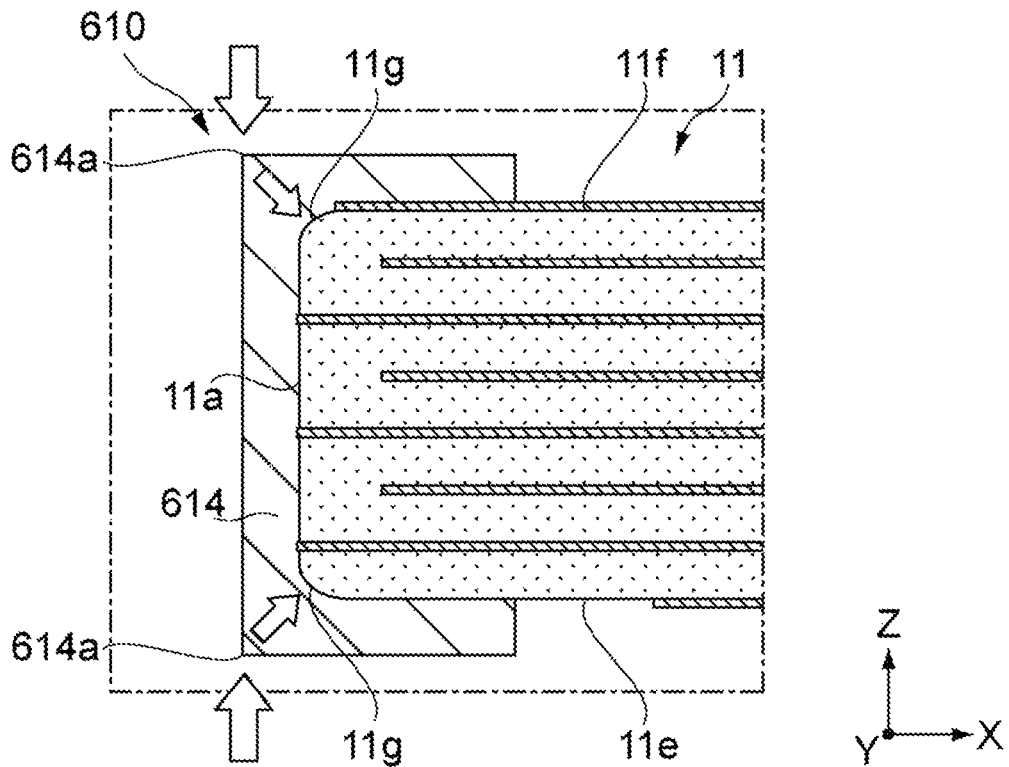
FIG. 5B is a partial cross-sectional view showing Comparative Example 2 of the multilayer piezoelectric element.

FIG. 5B is a partial cross-sectional view of a multilayer piezoelectric element 610 pertaining to Comparative Example 2. On the multilayer piezoelectric element 610 pertaining to Comparative Example 2, external electrodes 614 constituted differently from those of the multilayer piezoelectric element 10 pertaining to this embodiment, are provided. The external electrodes 614 are provided as flat faces whose top and bottom faces in the Z-axis direction run along the XY plane.

On the external electrodes 614, a stress tends to apply to the ridge parts 614a on the outward side, in the X-axis direction, of the top and bottom faces in the Z-axis direction. Any stress that applies to the ridge parts 614a of the external electrodes 614 tends to concentrate on the ridge parts 11g of the ceramic body 11. As a result, the multilayer piezoelectric element 610 tends to generate cracks originating from the ridge parts 11g of the ceramic body 11.

[Method for Manufacturing Multilayer Piezoelectric Element 10]

Figure 6:
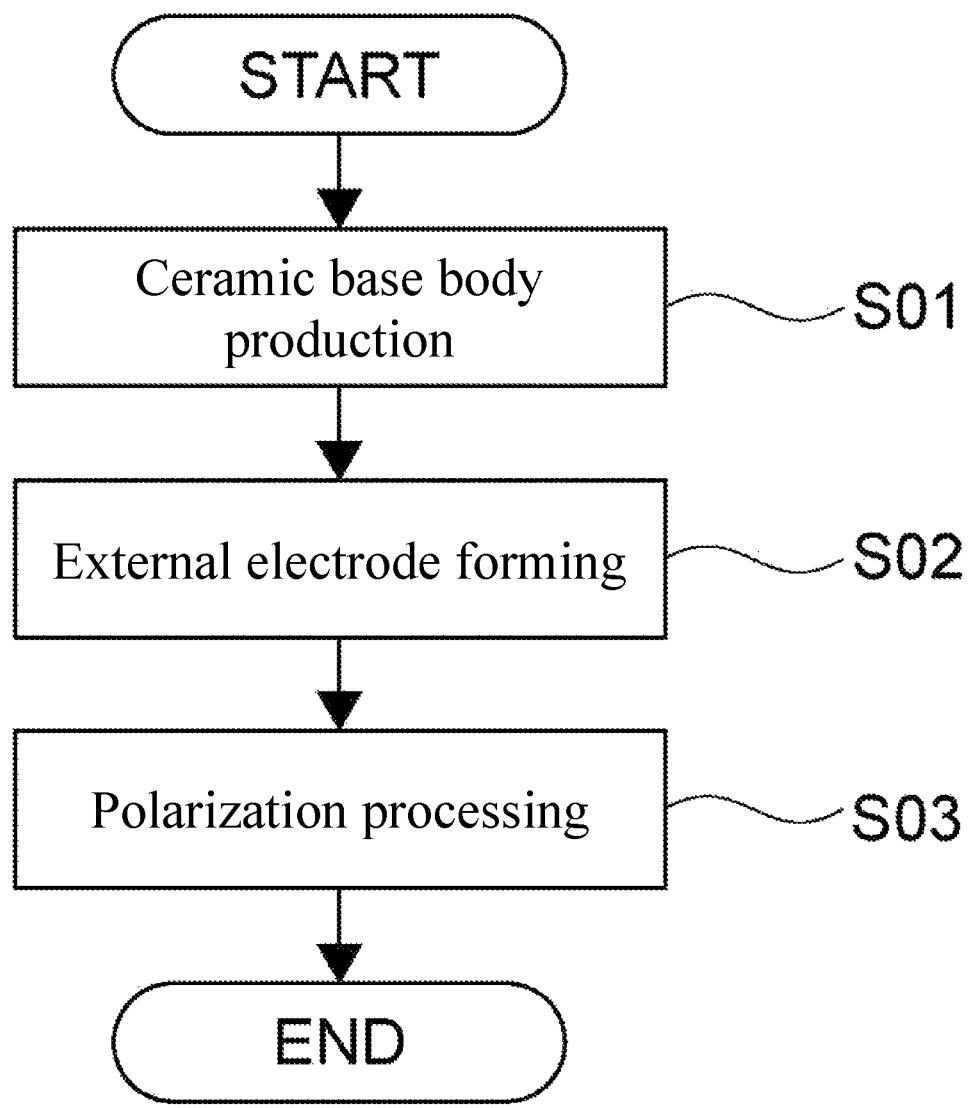
FIG. 6 is a flow chart showing a method for manufacturing the multilayer piezoelectric element.
Figure 7:
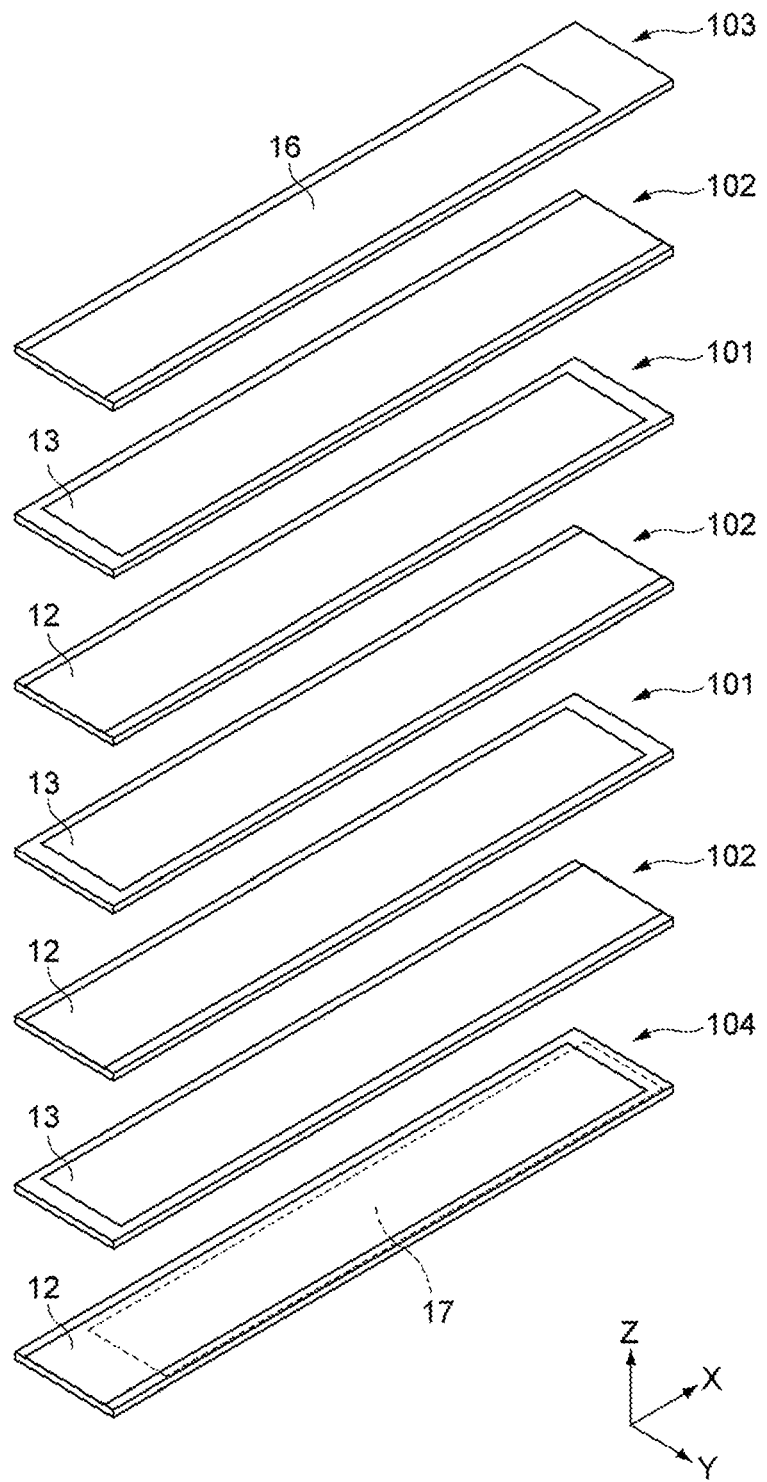
FIG. 7 is a perspective view showing a process for manufacturing the multilayer piezoelectric element.
Figure 8:
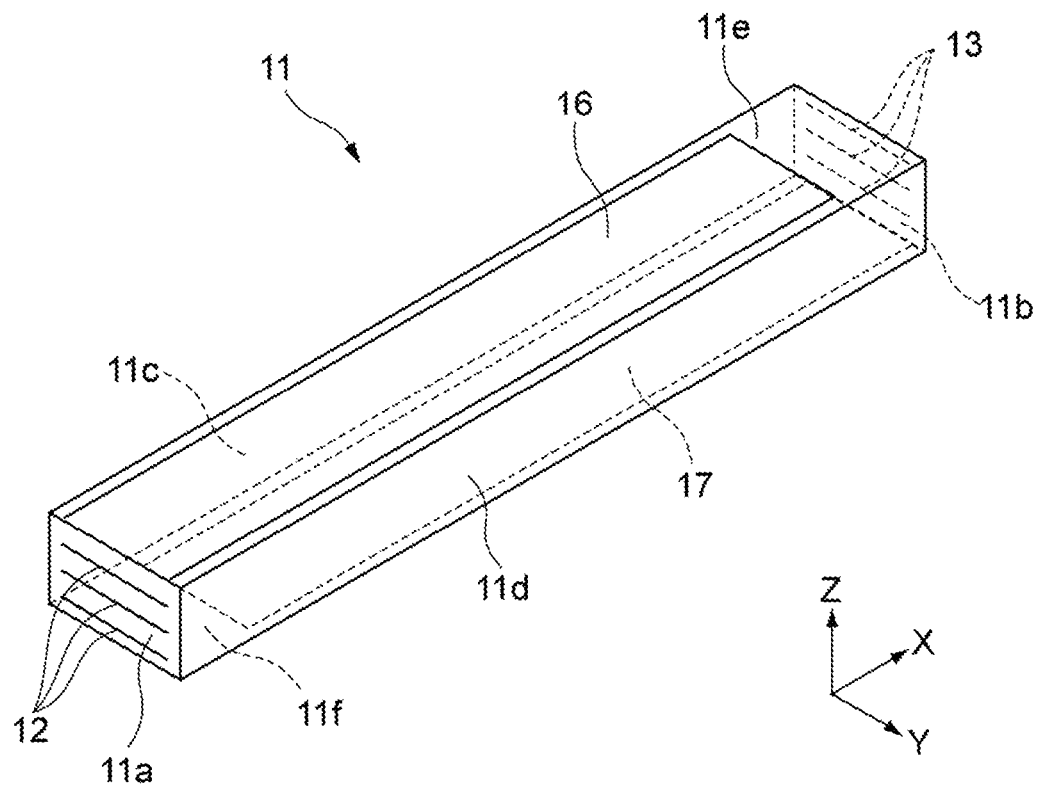
FIG. 8 is a perspective view showing a process for manufacturing the multilayer piezoelectric element.

FIG. 6 is a flow chart showing the method for manufacturing the multilayer piezoelectric element 10. FIGS. 7 and 8 are drawings showing the process for manufacturing the multilayer piezoelectric element 10. The following explains the method for manufacturing the multilayer piezoelectric element 10 according to FIG. 6, by referring to FIGS. 7 and 8 as deemed appropriate.

(Step S01: Ceramic Body Production)

In step S01, a ceramic body 11 is produced. In step S01, first the ceramic sheets 101, 102, 103, 104 shown in FIG. 7 are prepared. The ceramic sheets 101, 102, 103, 104 are piezoelectric green sheets whose primary component is a piezoelectric ceramic.

The piezoelectric green sheets are obtained by forming into sheet shapes a ceramic slurry obtained as a mixture of tentatively sintered piezoelectric ceramic powder, organic polymer binder, and plasticizer. A roll coater, doctor blade, etc., may be used to form the piezoelectric green sheets, for example.

On each of the ceramic sheets 101, 102, 103, 104, a conductive paste is applied in a prescribed pattern, thus forming unsintered internal electrodes 12, 13 and surface electrodes 16, 17. The screen printing method, gravure printing method, etc., may be used to apply the conductive paste, for example.

To be specific, the first internal electrodes 12 are formed on the ceramic sheets 101. The second internal electrodes 13 are formed on the ceramic sheets 102. The first surface electrode 16 is formed on the ceramic sheet 103. The first internal electrode 12 and second surface electrode 17 are formed on the ceramic sheet 104.

And, by stacking the ceramic sheets 101, 102, 103, 104 in the Z-axis direction in the order shown in FIG. 7 and then thermally pressure-bonding them, an unsintered ceramic body 11 is obtained. Uniaxial pressurization, hydrostatic pressurization, etc., may be used to thermally pressure-bond the ceramic sheets 101, 102, 103, 104, for example.

Next, the unsintered ceramic body 11 is put through a binder removal process by heating it to a temperature between 300 and 500° C., for example. After completing the binder removal process, the ceramic body 11 is sintered by heating it to a temperature between 900 and 1200° C., for example. As a result, the ceramic body 11 shown in FIG. 8 is obtained.

So that the ridge parts 11g of the ceramic body 11 become smooth curved faces, barreling may be applied to the ceramic body 11, for example. In this case, the curvature of the ridge parts 11g of the ceramic body 11 can be adjusted based on the barreling conditions. The ceramic body 11 may be barreled before sintering or after sintering.

(Step S02: External Electrode Forming)

In step S02, external electrodes 14, 15 are formed on the ceramic body 11 obtained in step S01, to produce the multilayer piezoelectric element 10 shown in FIGS. 1 to 3. In step S02, the external electrodes 14, 15 may be formed by, for example, applying a conductive paste on both end parts of the ceramic body 11 in the X-axis direction and then baking the conductive paste.

The printing method, dip coating method, etc., may be used to apply the conductive paste, for example. The composition of, and conditions for applying, the conductive paste can be determined in any way as deemed appropriate so that, after baking, the external electrodes 14, 15 are shaped as shown in FIGS. 1 and 2. Also, the shape of the conductive paste may be adjusted after it has been applied to the ceramic body 11.

It should be noted that the processing in step S02 may be performed in step S01. For example, the unsintered conductive paste may be applied on both end parts of the unsintered ceramic body 11 in the X-axis direction. This way, sintering of the ceramic body 11, and baking of the external electrodes 14, 15, can be performed at the same time.

(Step S03: Polarization Processing)

In step S03, the multilayer piezoelectric element 10 is put through a polarization process. To be specific, the polarization process involves applying a high direct-current electric field oriented in the Z-axis direction, to the multilayer piezoelectric element 10, and thereby aligning the direction of the spontaneous polarization of the piezoelectric ceramic constituting the ceramic layers 18. As a result, piezoelectric activity is added to the piezoelectric ceramic and the multilayer piezoelectric element 10 can now demonstrate this function.

[Constitution of Piezoelectric Vibration Apparatus 20]

The multilayer piezoelectric element 10 can be widely used as a piezoelectric actuator that operates in the X-axis direction by means of the transverse piezoelectric effect. A piezoelectric vibration apparatus that generates vibration, is an example of application of the multilayer piezoelectric element 10. The following explains a unimorph-type piezoelectric vibration apparatus 20 constituted with the multilayer piezoelectric element 10.

Figure 9:
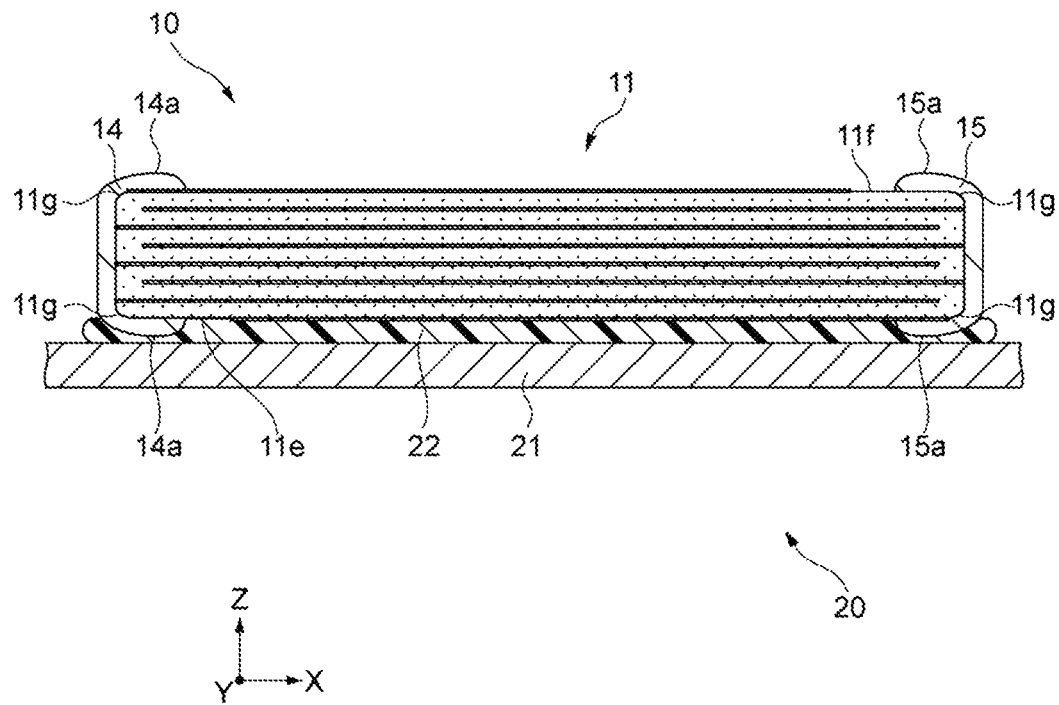
FIG. 9 is a cross-sectional view of a piezoelectric vibration apparatus that uses the multilayer piezoelectric element.

FIG. 9 is a cross-sectional view of the piezoelectric vibration apparatus 20. The piezoelectric vibration apparatus 20 comprises the multilayer piezoelectric element 10, a vibration plate 21, and an adhesive layer 22. The vibration plate 21 is constituted as a flat plate extending along the XY plane, and placed in a manner facing the first principal face 11e of the multilayer piezoelectric element 10. The adhesive layer 22 is placed between the multilayer piezoelectric element 10 and the vibration plate 21.

The vibration plate 21 is formed by a metal, glass, etc., for example, and has flexibility in the Z-axis direction. The adhesive layer 22 is formed by a resin material, etc., and joins the multilayer piezoelectric element 10 and the vibration plate 21. The adhesive layer 22 adheres to the bottom part of the multilayer piezoelectric element 10 in the Z-axis direction, and to the top face of the vibration plate 21 in the Z-axis direction.

The adhesive layer 22 is filled between the first principal face 11e of the ceramic body 11 and the vibration plate 21, and joins the ceramic body 11 and the vibration plate 21 over a wide range. As a result, the piezoelectric vibration apparatus 20 achieves high joining strength between the multilayer piezoelectric element 10 and the vibration plate 21 via the adhesive layer 22.

Additionally, of the external electrodes 14, 15, the parts that include the apex parts 14a, 15a projecting downward in the Z-axis direction from the first principal face 11e, protrude into the adhesive layer 22. This expands the adhesion area between the external electrodes 14, 15 and the adhesive layer 22 and also achieves an anchor effect, thereby increasing the joining strength between the external electrodes 14, 15 and the vibration plate 21.

In the piezoelectric vibration apparatus 20, the high joining strength, particularly between the vibration plate 21 and the external electrodes 14, 15 placed at both end parts of the multilayer piezoelectric element 10 in the X-axis direction, which are subject to the greatest displacement in the X-axis direction, facilitates the transmission, to the vibration plate 21, of any expansion/contraction of the multilayer piezoelectric element 10 in the X-axis direction. As a result, the piezoelectric vibration apparatus 20 can cause the vibration plate 21 to vibrate more strongly.

Also, in the piezoelectric vibration apparatus 20, the high joining strength between the external electrodes 14, 15 and the vibration plate 21 prevents the external electrodes 14, 15 from easily separating from the vibration plate 21, even when the multilayer piezoelectric element 10 expands/contracts greatly and the external electrodes 14, 15 displace in the X-axis direction greatly as a result. Because of this, the piezoelectric vibration apparatus 20 maintains a high vibration of the vibration plate 21.

When the piezoelectric vibration apparatus 20 is driven, any expansion/contraction of the multilayer piezoelectric element 10 in the X-axis direction is transmitted to the vibration plate 21 primarily from the external electrodes 14, 15 placed at both end parts in the X-axis direction. This means that, when the piezoelectric vibration apparatus 20 is driven, a large stress applies from the vibration plate 21 to the apex parts 14a that are the closest parts of the external electrodes 14, 15 to the vibration plate 21.

As described above, however, the multilayer piezoelectric element 10 is such that any stress that applies to the apex parts 14a, 15a of the external electrodes 14, 15 does not easily concentrate on the ridge parts 11g of the ceramic body 11. As a result, the piezoelectric vibration apparatus 20 does not easily generate a failure caused by cracks originating from the ridge parts 11g of the ceramic body 11 of the multilayer piezoelectric element 10, and therefore achieves high reliability.

[Method for Manufacturing Piezoelectric Vibration Apparatus 20]

Figure 10:
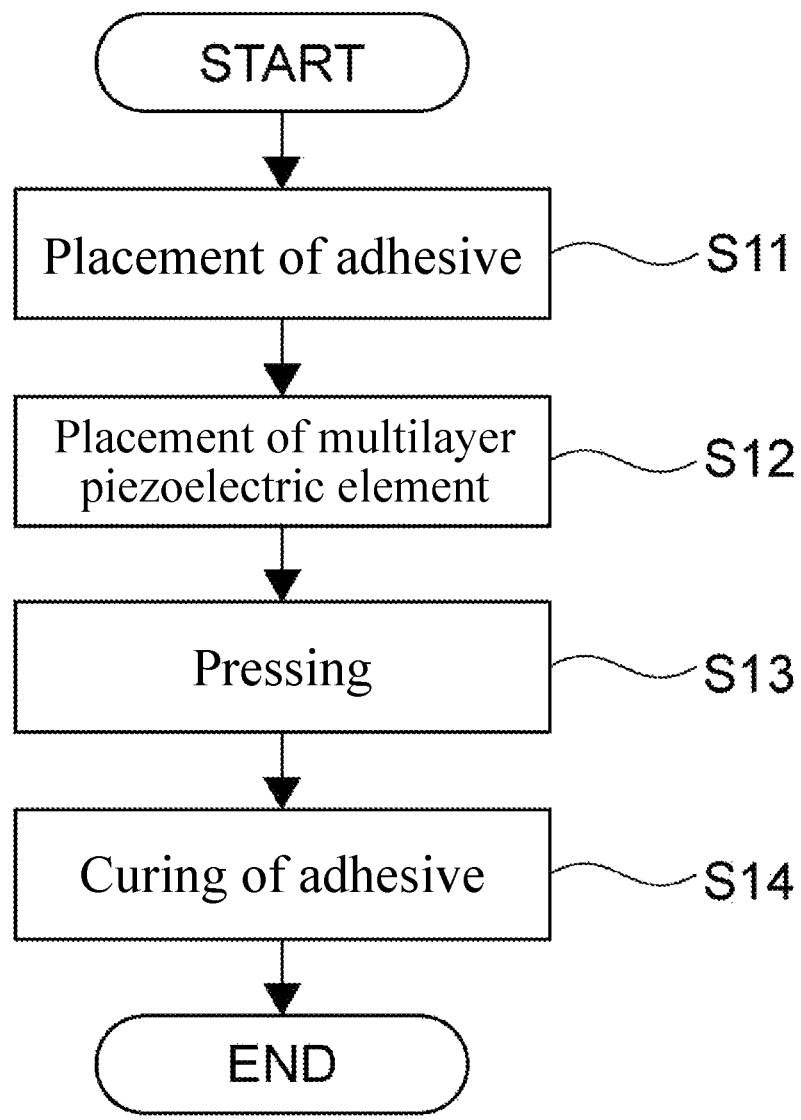
FIG. 10 is a flow chart showing a method for manufacturing the piezoelectric vibration apparatus.
Figure 11A:
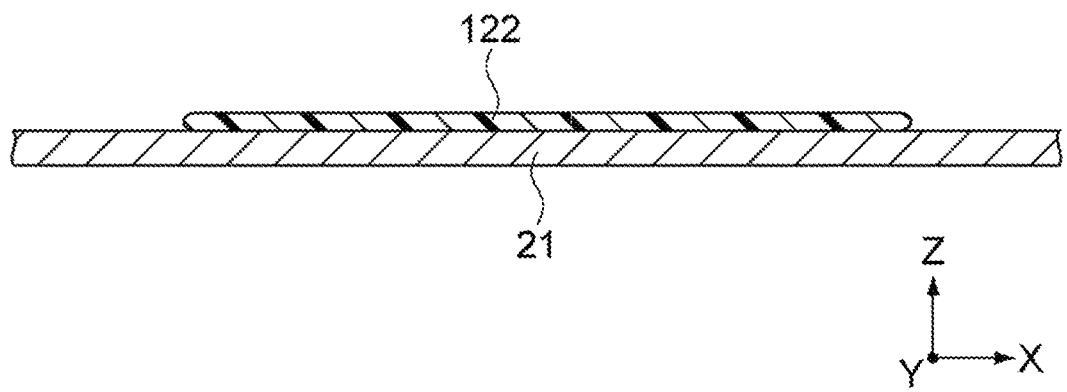
FIG. 11A is a perspective view showing a process for manufacturing the piezoelectric vibration apparatus.
Figure 11B:
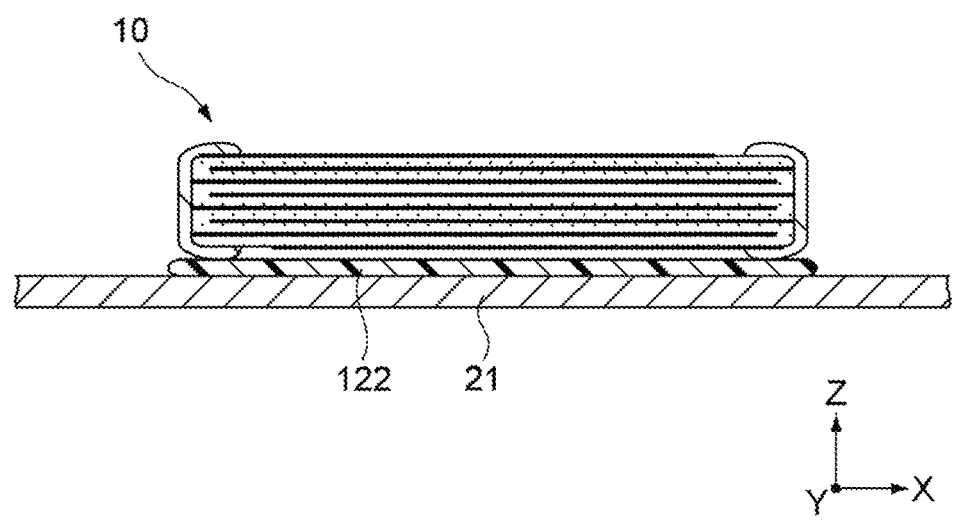
FIG. 11B is a perspective view showing a process for manufacturing the piezoelectric vibration apparatus.

FIG. 10 is a flow chart showing the method for manufacturing the piezoelectric vibration apparatus 20. First, as shown in FIG. 11A, an adhesive 122 from which to form an adhesive layer 22 is placed on a vibration plate 110 (step S11). Next, as shown in FIG. 11B, the multilayer piezoelectric element 10 is placed on the adhesive 122 (step S12).

Figure 11C:
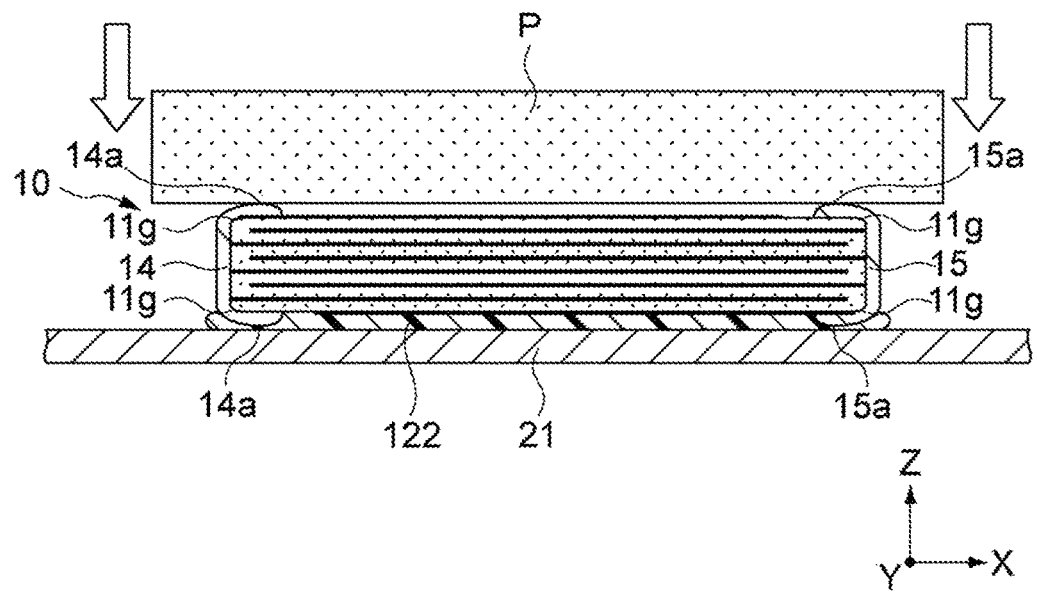
FIG. 11C is a perspective view showing a process for manufacturing the piezoelectric vibration apparatus.

Then, as shown in FIG. 11C, the multilayer piezoelectric element 10 is pushed downward from above in the Z-axis direction using a pressing member P (step S13). This way, the parts of the external electrodes 14, 15, which include the apex parts 14a projecting downward in the Z-axis direction from the first principal face 11e, enter the adhesive 122 and the adhesive 122 adheres to the multilayer piezoelectric element 10 along its surface.

Thereafter, the adhesive 122 is cured (step S14). As a result, an adhesive layer 22 is formed and the piezoelectric vibration apparatus 20 shown in FIG. 9 is obtained. As described above, this manufacturing method allows the piezoelectric vibration apparatus 20 to be manufactured easily through bonding of the multilayer piezoelectric element 10 and the vibration plate 21 using the adhesive 122.

In step S13 of this manufacturing method, the stress from the pressing member P applies to the apex parts 14a, 15a projecting upward in the Z-axis direction when the multilayer piezoelectric element 10 is pressed. Additionally, in step S13, the stress from the adhesive 122 also applies to the apex parts 14a, 15a projecting downward in the Z-axis direction and entering the adhesive 122.

With the multilayer piezoelectric element 10, however, any stress that applies to the apex parts 14a, 15a of the external electrodes 14, 15 does not easily concentrate on the ridge parts 11g of the ceramic body 11, as described above. As a result, this manufacturing method can reduce generation of cracks in the multilayer piezoelectric element 10 originating from the ridge parts 11g of the ceramic body 11.

In addition, the multilayer piezoelectric element 10 of the piezoelectric vibration apparatus 20 is such that, because the external electrodes 14, 15 project downward in the Z-axis direction from the first principal face 11e of the ceramic body 11, a concave region curving upward in the Z-axis direction is formed between the external electrodes 14, 15. In step S13, the adhesive 122 is filled in the concave region between the external electrodes 14, 15.

This means that, in step S13, the thickness of the adhesive 122 between the first principal face 11e of the ceramic body 11 and the vibration plate 21 is not smaller than the amount of projection of the external electrodes 14, 15 downward in the Z-axis direction. This way, a sufficient thickness of the adhesive layer 22 is ensured and thus the piezoelectric vibration apparatus 20 achieves high reliability.

[Electronic Device 30]

Figure 12A:
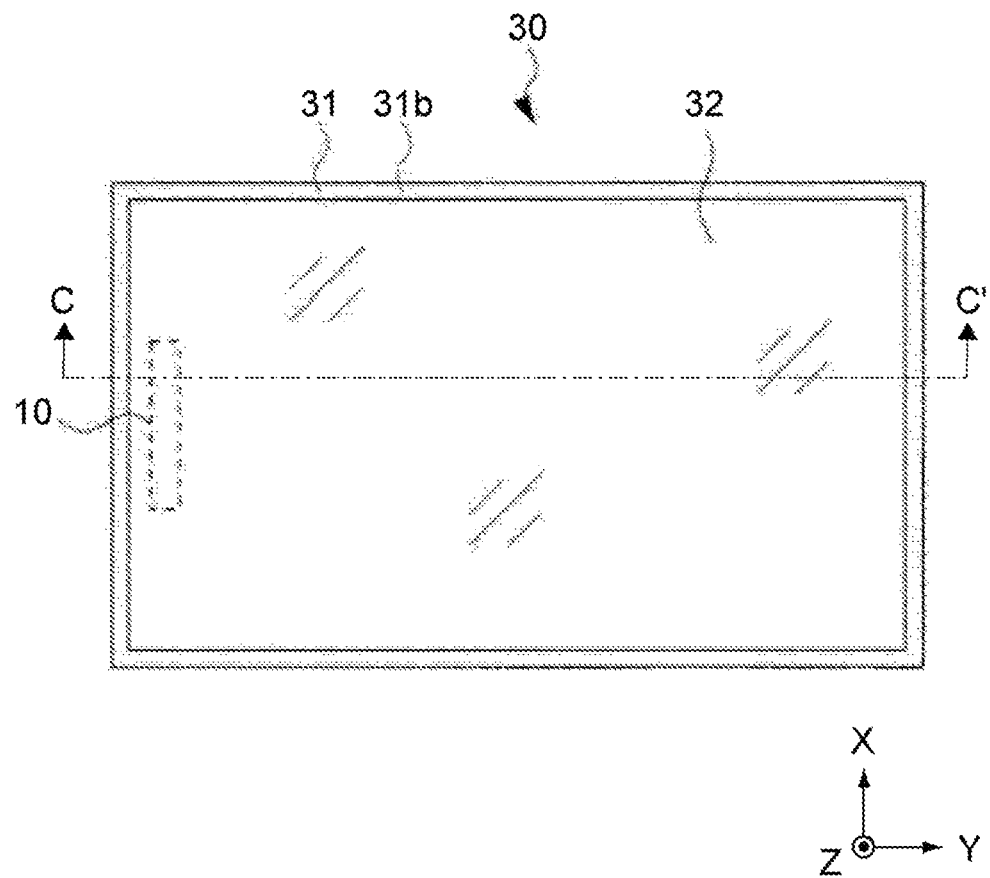
FIG. 12A is a plan view of an electronic device that uses the multilayer piezoelectric element.
Figure 12B:
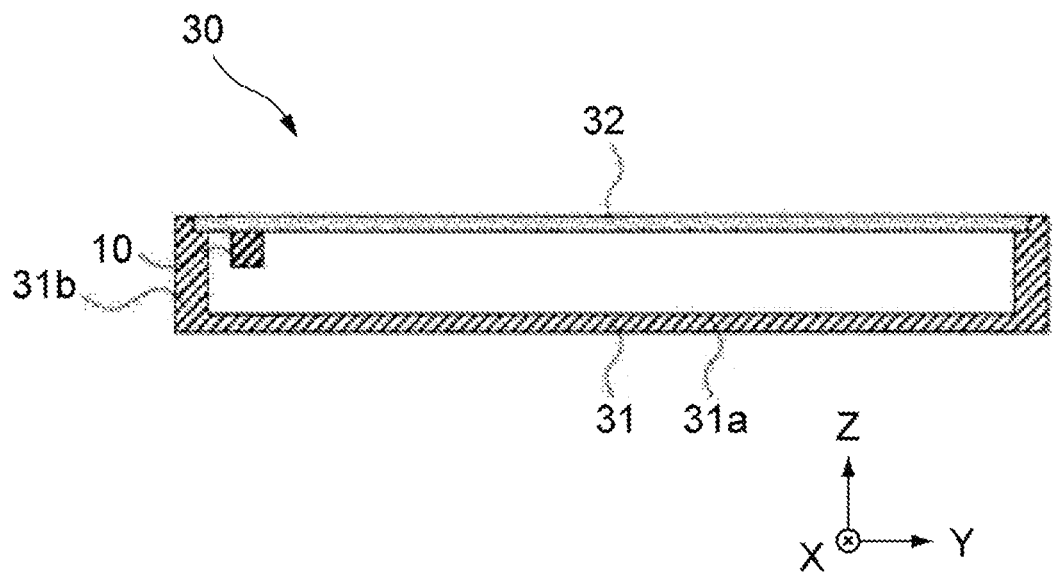
FIG. 12B is a cross-sectional view of the electronic device along line C-C' in FIG. 12A.

FIGS. 12A and 12B are drawings showing schematic representations of an electronic device 30 that uses the multilayer piezoelectric element 10. FIG. 12A is a plan view of the electronic device 30. FIG. 12B is a cross-sectional view of the electronic device 30 along line C-C' in FIG. 12A. The electronic device 30 is constituted as a multifunctional mobile communication terminal generally referred to as "smartphone."

The electronic device 30 has the multilayer piezoelectric element 10, a housing 31, and a panel 32. The housing 31 has a bottom plate 31a extending rectangularly along the XY plane and a frame body 31b extending from the periphery of the bottom plate 31a upward in the Z-axis direction, and is formed as a box shape that opens upward in the Z-axis direction. The panel 32 extends rectangularly along the XY plane and closes the housing 31 from above in the Z-axis direction.

The housing 31 encloses each constitution (not illustrated) of circuit boards, electronic components, etc., for achieving the various functions of the electronic device 30. The panel 32 is constituted as a touch panel. In other words, the panel 32 provides both an image display function to display images and an input function to detect input operations performed by the user using a finger, etc.

It should be noted that the panel 32 is not limited to a touch panel, and it need not have the constitution described above, either. For example, the panel 32 may be a touch pad that does not have an image display function, but has only an input function. Also, the panel 32 may be a protective panel that protects a touch panel provided separately as part of the electronic device 30.

The multilayer piezoelectric element 10 is adhered to the bottom face of the panel 32 in the Z-axis direction and faces the bottom plate 31a inside the housing 31. The position of the multilayer piezoelectric element 10 on the bottom face of the panel 32 in the Z-axis direction can be determined in any way as desired. In the electronic device 30, the panel 32 fulfills the function the vibration plate 21 provides in the piezoelectric vibration apparatus 20 shown in FIG. 9.

To be specific, the electronic device 30 allows the panel 32 to vibrate as a result of the multilayer piezoelectric element 10 expanding/contracting in the X-axis direction. For this reason, preferably the panel 32 is made primarily of a glass, acrylic resin, or other material that can vibrate in a favorable manner. Also, preferably the adhesive layer that adheres the multilayer piezoelectric element 10 and the panel 32 is constituted in the same way as the adhesive layer 22 in the piezoelectric vibration apparatus 20.

The electronic device 30 can generate sound via air conduction, bone conduction, etc., by vibrating the panel 32, to provide sound information to the user. Also, the electronic device 30 can vibrate the panel 32 to, for example, present haptic sensations to the user who performs input operations on the panel 32.

It should be noted that, while the top face of the panel 32 in the Z-axis direction is typically a flat surface, it may also be a warped surface, etc., for example. In addition, the electronic device 30 is not limited to a smartphone, and it may also be constituted as a tablet terminal, notebook personal computer, mobile phone, watch, photo stand, or a remote control or operating part, etc., of various types of devices.

OTHER EMBODIMENTS

The foregoing explained an embodiment of the present invention; however, it goes without saying that the present invention is not limited in any way to the aforementioned embodiment and various modifications can be added.

For example, the external electrodes 14, 15 of the multilayer piezoelectric element 10 extend onto both of the principal faces 11e, 11f in the aforementioned embodiment; however, they may extend only onto the first principal face 11e and not onto the second principal face 11f. In this case, too, the effect of reducing the generation of cracks originating from the ridge parts 11g on the first principal face 11e side of the ceramic body 11 can still be achieved.

In the present disclosure where conditions and/or structures are not specified, a skilled artisan in the art can readily provide such conditions and/or structures, in view of the present disclosure, as a matter of routine experimentation. Also, in the present disclosure including the examples described above, any ranges applied in some embodiments may include or exclude the lower and/or upper endpoints, and any values of variables indicated may refer to precise values or approximate values and include equivalents, and may refer to average, median, representative, majority, etc. in some embodiments. Further, in this disclosure, "a" may refer to a species or a genus including multiple species, and "the invention" or "the present invention" may refer to at least one of the embodiments or aspects explicitly, necessarily, or inherently disclosed herein. The terms "constituted by" and "having" refer independently to "typically or broadly comprising", "comprising", "consisting essentially of", or "consisting of" in some embodiments. In this disclosure, any defined meanings do not necessarily exclude ordinary and customary meanings in some embodiments.

The present application claims priority to Japanese Patent Application No. 2017-152262, filed Aug. 7, 2017, and No. 2018-034063, filed Feb. 28, 2018, each disclosure of which is incorporated herein by reference in its entirety including any and all particular combinations of the features disclosed therein.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A multilayer piezoelectric element, comprising:
a ceramic body formed by a piezoelectric ceramic and having first and second end faces facing a longitudinal direction, first and second principal faces facing a thickness direction perpendicular to the longitudinal direction, and a first pair of ridge parts connecting the first and second end faces, respectively, with the first principal face, and a second pair of ridge parts connecting the first and second end faces, respectively, with the second principal face, wherein the first pair and the second pair of ridge parts are constituted by curved faces as viewed in a direction perpendicular to the longitudinal direction and the thickness direction;
a pair of external electrodes covering the first and second end faces, and extending from the first and second end faces, respectively, onto the first principal face via the first pair of ridge parts, respectively, each one of the pair of external electrodes having a projecting portion projecting in the thickness direction in an area overlapping the first principal face as viewed in the thickness direction, where an apex point which is a thickest point of the projecting portion and thicker than all other parts of a portion of the each one of the pair of external electrodes, which is above a plane defined by the first principal face, as measured with respect to the plane defined by the first principal face, is present in the projecting portion at a location away from one of the first pair of ridge parts adjacent to the apex point in the longitudinal direction;

multiple internal electrodes stacked inside the ceramic body along the thickness direction and connected alternately to the pair of external electrodes along the thickness direction; and a first surface electrode provided on the first principal face, said first surface electrode connected to one of the pair of external electrodes different from another of the pair of external electrodes to which one of the multiple internal electrodes immediately adjacent in the thickness direction is connected.

2. The multilayer piezoelectric element according to claim 1, wherein the pair of external electrodes extend from the first and second end faces, respectively, onto the second principal face via the second pair of ridge parts, respectively, and each one of the pair of external electrodes has a projecting portion projecting in the thickness direction in an area overlapping the second principal face as viewed in the thickness direction, where an apex point which is a thickest point of the projecting portion and thicker than all other parts of a portion of the each one of the pair of external electrodes, which is below a plane defined by the second principal face, as measured with respect to the plane defined by the second principal face, is present in the projecting portion at a location away from one of the second pair of ridge parts adjacent to the apex point in the longitudinal direction, and wherein a second surface electrode is provided on the second principal face, said second surface electrode connected to one of the pair of external electrodes different from another of the pair of external electrodes to which one of the multiple internal electrodes immediately adjacent in the thickness direction is connected.

3. The multilayer piezoelectric element according to claim 1, wherein corners of the pair of external electrodes between the first principal face and the first and second end faces, respectively, are chamfered along the curved faces of the first pair of ridge parts.

4. An electronic device, comprising:
the multilayer piezoelectric element according to claim 1;
a panel having the multilayer piezoelectric element adhered to it in a manner facing the panel in the thickness direction; and
a housing retaining the panel.

5. The multilayer piezoelectric element according to claim 1, wherein the apex point of the projecting portion of the each one of the pair of external electrodes on the first principal face is higher than any part of the first surface electrode in the thickness direction with respect to the first principal face.

6. A piezoelectric vibration apparatus, comprising:
the multilayer piezoelectric element according to claim 1;
a vibration plate facing the multilayer piezoelectric element in the thickness direction; and
an adhesive layer placed between the multilayer piezoelectric element and the vibration plate.

7. The piezoelectric vibration apparatus according to claim 6, wherein the vibration plate is placed on a side of the multilayer piezoelectric element facing the first principal face.

8. The piezoelectric vibration apparatus according to claim 7, wherein the pair of external electrodes of the multilayer piezoelectric element are placed partially inside the adhesive layer.

9. The piezoelectric vibration apparatus according to claim 7, wherein the adhesive layer is filled between the first principal face and the vibration plate.

* * * * *